United States Patent [19]

Casagrande

[11] Patent Number: 4,807,188
[45] Date of Patent: Feb. 21, 1989

[54] NONVOLATILE MEMORY DEVICE WITH A HIGH NUMBER OF CYCLE PROGRAMMING ENDURANCE

[75] Inventor: Giulio Casagrande, Vignate, Italy

[73] Assignee: SGS-Thomson Microelectronics s.p.a., Catania, Italy

[21] Appl. No.: 199,077

[22] Filed: May 26, 1988

[30] Foreign Application Priority Data

May 27, 1987 [IT] Italy ................. 83629 A/87

[51] Int. Cl.$^4$ ............... G11C 11/34; G11C 7/00; H03K 3/01
[52] U.S. Cl. ................................ 365/182; 365/189; 365/185; 307/296 R
[58] Field of Search ............ 365/45, 182, 189, 185; 307/296 R

[56] References Cited

U.S. PATENT DOCUMENTS

| | | | |
|---|---|---|---|
| 4,616,339 | 10/1986 | Cuppens et al. | 365/185 |
| 4,667,312 | 5/1987 | Doung et al. | 365/45 |
| 4,677,590 | 6/1987 | Arakawa | 365/185 |
| 4,761,765 | 8/1988 | Hashimoto | 365/185 |

Primary Examiner—Terrell W. Fears
Assistant Examiner—Melissa J. Koval
Attorney, Agent, or Firm—Pollock, Vande Sande & Priddy

[57] ABSTRACT

An electrically alterable, non volatile memory device capable of enduring a high number of cycles utilizes an array of "semidouble" cells, each formed by a pair of elementary EEPROM cells connected substantially in parallel and a single select transistor. A special program lines biasing circuit generating a bias voltage representative of a condition wherein one of the two elementary EEPROM structure is broken and sense amplifiers comprising a comparator circuit comparing the current flowing through an addressed semidouble memory cell with the current flowing through a reference cell comprising a pair of virgin EEPROM type elementary cells to ensure operability of each bit of the memory also when one of the two elementary cells supporting the bit fails. Different from known memories, only the EEPROM structure is duplicated while column lines, select lines and ancillary circuitry don't require duplication.

3 Claims, 3 Drawing Sheets 4,807,188

NONVOLATILE MEMORY DEVICE WITH A HIGH NUMBER OF CYCLE PROGRAMMING ENDURANCE

BACKGROUND OF THE INVENTION

One of the main drawbacks of nonvolatile memories exploiting the Fowler-Nordheim tunnelling mechanism through ultrathin oxide layers grown on monocrystalline silicon for programming and erasing is represented by the difficulty of ensuring a high number of programming and erasing cycles, i.e. modifications of stored data.

The integrated structure of an elementary memory cell, if appropriately biased, has an intrinsic endurance which may be measured to exceed several million programming cycles. However, considering that a memory contains a very large number of integrated elementary cells, even in a memory of relatively small dimensions, the probability that one of the elementary cells does not reach just about 100,000 programming cycles is very high. Moreover there isn't a screening method which allows to detect, and possibly eliminate, memory devices having one or more faulty cells destined to fail before reaching a certain nominal number of cycles, or to substitute said faulty elementary cell or cells by means of redundancy techniques.

Of course the failure of a single memory cell is sufficient to determine the nonoperability of a whole memory device, be it a data storage memory or any other integrated device provided with an internal nonvolatile memory section.

Redundancy techniques capable of ensuring data integrity also in the presence of a no longer operating cell (and therefore of an incorrect bit) are expensive to implement both in terms of an increased memory area requirement, of software and/or hardware complexity and of an additional delay introduced in the data flow.

As a consequence, nonvolatile memories with dimensions in the order of just 1,000 bit may ensure at most a correct operation for about 10,000 cycles, notwithstanding the fact that the great majority of the memory cells may continue to work well beyond 1,000,000 cycles.

Lately attempts have been made for improving such a penalizing condition. Substantially these proposals for overcoming this technical problem are based on using two elementary memory cells per bit, i.e. a double memory cell. The principle on which said proposals is based is that of ensuring the operation of the memory bit in case one of the two elementary cells supporting the data should fail.

Thus each bit of the memory array will result as nonoperating only when both the supporting memory cells happen to be broken.

This permits memory to a high density memory to ensure a number of cycles close to the intrinsic one of the single cell. This because a nonoperative condition of the device will no longer happen when the first of the two elementary cells of each bit breaks but when a particular bit will show both cells broken. This last event has a significative probability to take place only after many cells have failed, i.e. when a number of programming cycles close to the intrinsic endurance number of the elementary cell integrated structure have been performed.

A first example of this technical approach is described in the paper: "A 55 ns CMOS EEPROM" presented by R. Zeman, et al. at the International Solid State Circuits Conference (ISSCC) of 1984, X section, Feb. 23, 1984. According to this proposal, each bit is stored by a pair of EEPROM type elementary memory cells, each having its own select transistor, and wherein one cell contains the value of the bit and the other the negate thereof.

This proposal, although solving the fundamental technical problem, requires a double area in respect to the same capacity memory made with single elementary cells and further requires duplication of the column (bit) lines and of the column select lines. Moreover writing in the two elementary cells the value of the bit and of its negate requires a relatively complex circuitry and additional silicon area is required.

A second proposal has been presented by D. Cioaca et al. at the ISSCC of 1987 in a paper entitled: "A millioncycle CMOS 256 K EEPROM", VII section, Feb. 25, 1987.

According to such a proposal, the bit is supported by two cells, each having its own select transistor and two columns lines (bit lines), thus requiring duplication also of the contact area with the respective column line, as well as of the column select lines and of the sensing (reading) amplifier.

The output data of the two sense amplifiers are inputted to an OR gate to produce the final data. Both cells contain the value of the bit; in case one of the two cells breaks, because of the way the two cells are biased during reading, the sense amplifier reads the broken cell as a 0: consequently the OR gate at the output of the two sense amplifiers produces the correct bit also when one of the two cells is broken. Although this second proposal has advantages in respect to the first proposal discussed, this second proposal also requires very costly duplications in terms of occupied silicon area.

SUMMARY OF THE INVENTION

A main objective of the present invention is to provide a nonvolatile memory with a high number of cycle programming endurance and with a duplicated support for each single bit which requires a reduced number of components and ultimately a reduced silicon area.

The electrically alterable nonvolatile memory device of the present invention is organized as a rows and columns array of addressable memory cells, each memory cell being essentially formed by a pair of elementary EEPROM type, n-channel, memory cells. Contrary to the prior art technique, the two elementary EEPROM memory cells have a common drain connected to the source of a single select transistor. Therefore each memory cell may be considered, in terms of occupied area, as a "semidouble" cell, because only the memory transistor (i.e. the EEPROM structure) is substantially duplicated, while the relative select transistor, which commonly is formed within the active area of each elementary EEPROM cell, is unique for the two elementary EEPROM structures forming a memory cell.

The value of the stored data (bit) is therefore shared by both the elementary EEPROM cells and the ability of correctly reading the bit also when one of the two elementary EEPROM cells is broken (i.e. when the relative drain region is short circuited with the respective floating gate) is determined by suitably biasing the memory cell during the reading phase by providing an appropriate biasing voltage ($V_{CG}$) to the program line and therefore to the control gate of both elementary EEPROM cells of each memory cell and by comparing the current level through the particular addressed memory cell with the current level of a reference cell, the latter being substantially identical to a virgin "semidouble" memory cell (i.e. the floating gate of both the elementary EEPROM cells being free of electric charge), by means of an appropriate comparator.

According to a particularly preferred embodiment of the invention, the program line biasing circuit (i.e. biasing means for the control gates of the memory cells) is such as to provide a bias voltage $V_{CG}$ capable of determining the flow of a same electric current through any uncharged elementary EEPROM cell structure as well as through any broken elementary EEPROM cell structure, i.e. wherein the drain is in short circuit with the respective floating gate.

In this case, by providing for the currents drawn by a functioning memory cell to satisfy the following relation (as customary for EEPROM) type memory cells):

$$I_{C\ erased} < < I_{C\ virgin} < < I_{C\ written}$$

and further by providing for the current flowing through an eventually broken memory cell to be:

$$I_{C\ broken} = I_{C\ virgin}$$

The condition of a memory cell of the array will be as shown herein below:

|  | BOTH ELEMENTARY CELLS OPERATIVE | ONE CELL OPERATIVE AND ONE BROKEN |
| --- | --- | --- |
| AFTER ERASURE | 2 $I_C$ erased | $I_C$ erased + $I_C$ virgin |
| AFTER WRITING | 2 $I_C$ written | $I_C$ written + $I_C$ virgin |

The sense threshold may therefore be fixed as follows:

$$I_{C\ erased} + I_{C\ virgin} < I_{sensing} < I_{C\ written} + I_{C\ virgin}$$

Once the above relation is satisfied the "semidouble" memory cell of the memory device of the present invention has a relatively good latitude of operation.

Therefore in the device of the invention the column (bit) lines as well as the column selection lines and the sense amplifier are advantageously unique, thus allowing a corresponding saving of area occupied by the memory.

BRIEF DESCRIPTION OF THE DRAWINGS

The different aspects and advantages of the invention will result as evident through the detailed description of a particularly preferred embodiment thereof and by reference to the annexed drawings, wherein.

DESCRIPTION OF THE PREFERRED EMBODIMENT

Figure 1:
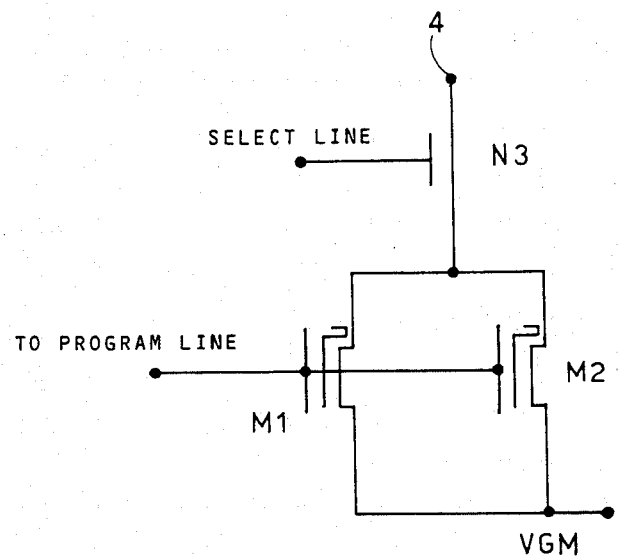
FIG. 1 is a circuit diagram of a semidouble cell of the memory of the invention.

As observed in FIG. 1, each memory cell of the device of the invention is composed of two elementary EEPROM cells M1 and M2. The sources of the two elementary EEPROM cells M1 and M2 are connected to a common potential node $V_{GM}$ of the whole memory array. The control gates of the two elementary EEPROM cells are connected in common to a program line. The drains of the two elementary EEPROM cells are connected in common and to the source of a select transistor N3 whose gate is connected to a select line and whose drain is connected to the relative column (bit) line's contact 4. Both the elementary EEPROM cells M1 and M2, as well as the single select transistor N3, are essentially n-channel MOS structures. The memory cell so configured may be defined as a "semidouble" cell, only the EEPROM memory structure (transistor) being duplicated while the associate select transistor remains unique.

Notably the malfunctioning of a memory cell after a certain number of cycles begins with a breakdown (short circuit or more or less resistive electrical connection between the floating gate and the drain region of the EEPROM memory structure) of the tunnel oxide. This makes the cell unable to continue to be charged and discharged or should this be still possible, retention of the electrical charge is relatively shortlived (loss of the stored data after a certain period of time). Therefore for the semidouble memory cell of FIG. 1 to be operative it is sufficient that, in case one of the two elementary EEPROM cells is broken, the other may be "written" and "erased" regularly and, above all that the content of the operative elementary cell be correctly readable by an appropriate sense amplifier without interferences caused by the electric current flowing through the broken elementary cell of the pair. This is obtained in a perfectly reliable way from the semidouble memory cell shown in FIG. 1. In erasing, the failure of one of the two elementary EEPROM memory cells doesn't have any effect upon the other. In writing, in case a short circuit between the drain and the floating gate of one of the two elementary EEPROM cells is present, the source, common to both elementary cells, is brought to the same potential of the drain. This doesn't alter the writing conditions of the operative elementary cell but by a negligible amount.

Reading of the stored data, at least according to a preferred embodiment of the invention, is based on biasing the pair of elementary EEPROM cells constituting a memory cell so that a broken elementary cell draws the same current drawn by a virgin elementary cell (i.e. of an uncharged cell having its floating gate free of electrical charge).

Figure 2:
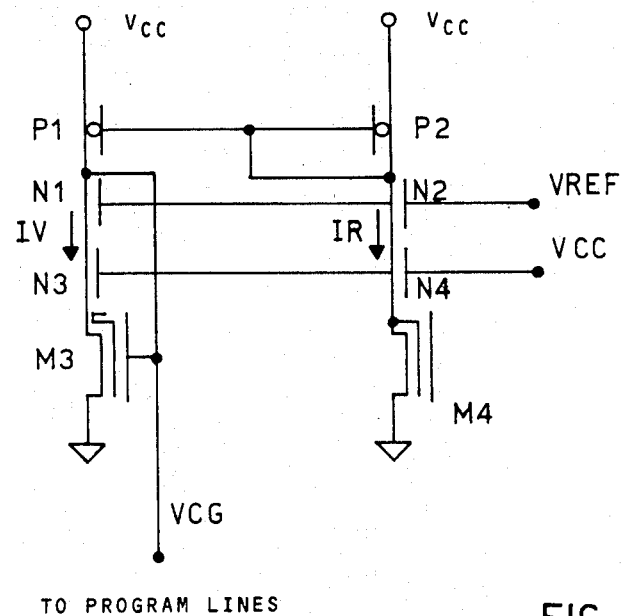
FIG. 2 shows the circuit diagram of a particularly preferred bias circuit for the program lines.

One of many possible bias circuits capable of ensuring such a condition is shown in FIG. 2.

The depicted bias circuit comprises essentially a current mirror formed by first and by a second, substantially identical, p-channel transistors, respectively P1 and P2, having their respective sources connected to a common potential supply node $V_{CC}$ and their respective gates connected in common and to the drain of said second transistor P2. The drains of said transistors P1 and P2 are connected, respectively, to the drains of a first pair of n-channel transistors N1 and N2, and the gates of said transistors P1 and P2 are connected to a constant bias voltage $V_{REF}$. Said n-channel transistors N1 and N2 have their sources connected, respectively, to the drains of a second pair of n-channel transistors N3 and N4. The gates of said n-channel transistors N3 and N4 are connected to the supply voltage $V_{CC}$. The sources of said n-channel transistors N3 and N4 are connected, respectively, to the drains of a pair of EEPROM type elementary memory cells M3 and M4, which have their respective sources connected to the common potential node $V_{GM}$ of the memory array. The elementary EEPROM cell M4 has its drain short-circuited with its own floating gate, simulating a failed EEPROM elementary cell. The control gate of the EEPROM elementary cell M3 is connected in common with the drain of the p-channel transistor P1 to the output node of the circuit. The two p-channel transistors with source connected to $V_{CC}$, namely P1 and P2, are essentially identical and, though made to operate under saturation conditions, they impose equality of the currents $I_V$ and $I_R$, therefore the output voltage $V_{CG}$ will adapt itself so as to satisfy this imposed equality condition of the two currents. Because the two EEPROM elementary cells with source connected to $V_{GM}$ in the two branches of the circuit are in practice a virgin cell (M3) and a broken cell (M4), the bias voltage $V_{CG}$ produced by the bias circuit and utilized for biasing the addressed memory cells of the array of the invention during the reading of the stored data, has therefore a value such as to ensure a current through any semidouble memory cell having one of the two elementary EEPROM cells broken equal to the current which would flow through a virgin semidouble memory cell.

The two n-channel transistors N3 and N4 with gate connected to $V_{CC}$ simulate the select transistor of the semidouble cells of the memory, while the two n-channel transistors N1 and N2 with gate connected to $V_{REF}$ impose the same bias to the drains of the two elementary memory cells M3 and M4. Of course also the semidouble memory cells of the array will have their drain biased to a potential equal to $V_{REF}-V_N$, wherein $V_N$ is the voltage drop through the n-channel select transistor.

As already said before, for such an embodiment of the memory device of the invention, the sensing threshold may be fixed to be:

$$I_{C\ erased}+I_{C\ virgin}<I_{sensing}<I_{C\ written}+I_{C\ virgin}$$

Figure 3:
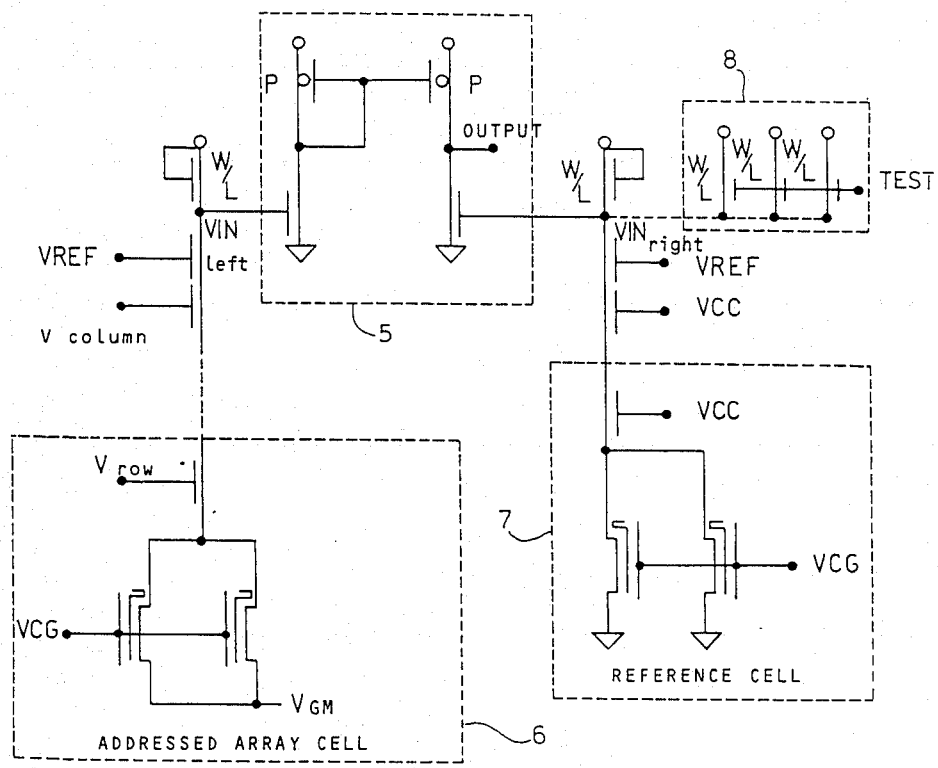
FIG. 3 is the circuit diagram of a suitable sensing (reading) circuit of the memory of the invention.

A suitable reading circuit is shown in FIG. 3. At the two inputs of the comparator stage, shown inside the dash line square 5, are applied, respectively, the current flowing through a certain addressed semidouble memory cell of the array, shown inside the dash line square 6. The reference cell 7 is entirely similar to a cell of the memory array (the two transistors with gate at $V_{CC}$ simulating the select transistor of a memory cell of the array and a column select transistor), it remains always virgin and is biased with a $V_{CG}$ voltage generated by the same bias circuit of FIG. 2, i.e. the same circuit which bias the addressed cell of the array. Also the drain potential of the reference cell is fixed at the value: $V_{REF}-V_N$, as that of the addressed cell of the memory array.

The operation of the sense circuit is as follows.

When the two elementary EEPROM cells of the addressed cell of the memory array are both virgin, the current and voltage conditions in the right hand side and in the left hand side branches of the circuit diagram of FIG. 3 (i.e. of the two branches connected respectively to the two inputs of the comparator circuit 5) are perfectly identical, being the sizes of the transistors essentially symmetrical. Therefore:

$$V_{IN\ LEFT}=V_{IN\ RIGHT}$$

and, as a consequence the voltage at the output of the comparator will be undetermined (sensing threshold). The threshold in terms of current is in fact $$I_{sensing}=2I_{virgin}$$

The sense function will be correctly performed by the comparator 5, in the way already described before, by altering, through writing and erasing the current flowing through at least one of the two elementary EEPROM cells of the addressed memory cell 6 of the array.

The sensing circuit may be conveniently completed by means which allow (for testing purposes) detection of whether one of the two elementary cells of the semidouble memory cell 1 of the array is no longer operative. Such a function may be implemented by enabling additional loads which shift the sensing threshold below the $I_{C\ virgin}$ value. As shown in FIG. 3, this may be implemented by providing unitary additional loads W/L, shown in the figure inside the dash line square 8, and enabling them according to need, by applying a $V_{CC}$ voltage to a "test" terminal.

In this test condition, i.e. with the sensing threshold $I_{sensing}<I_{virgin}$, a semidouble array cell containing a broken EEPROM elementary cell will always be recognized by the sensing circuit as "written" because:

$$I_{sensing}<I_{C\ erased}+I_{C\ virgin}<I_{C\ written}+I_{C\ virgin}$$

and therefore nonalterable (nonerasable).

In the example shown in FIG. 3, by enabling three equal loads in parallel with the right hand input load of the comparator circuit, the sensing threshold shifts to $$I_{sensing}=\tfrac{1}{2} I_{C\ virgin}$$

Figure 4:
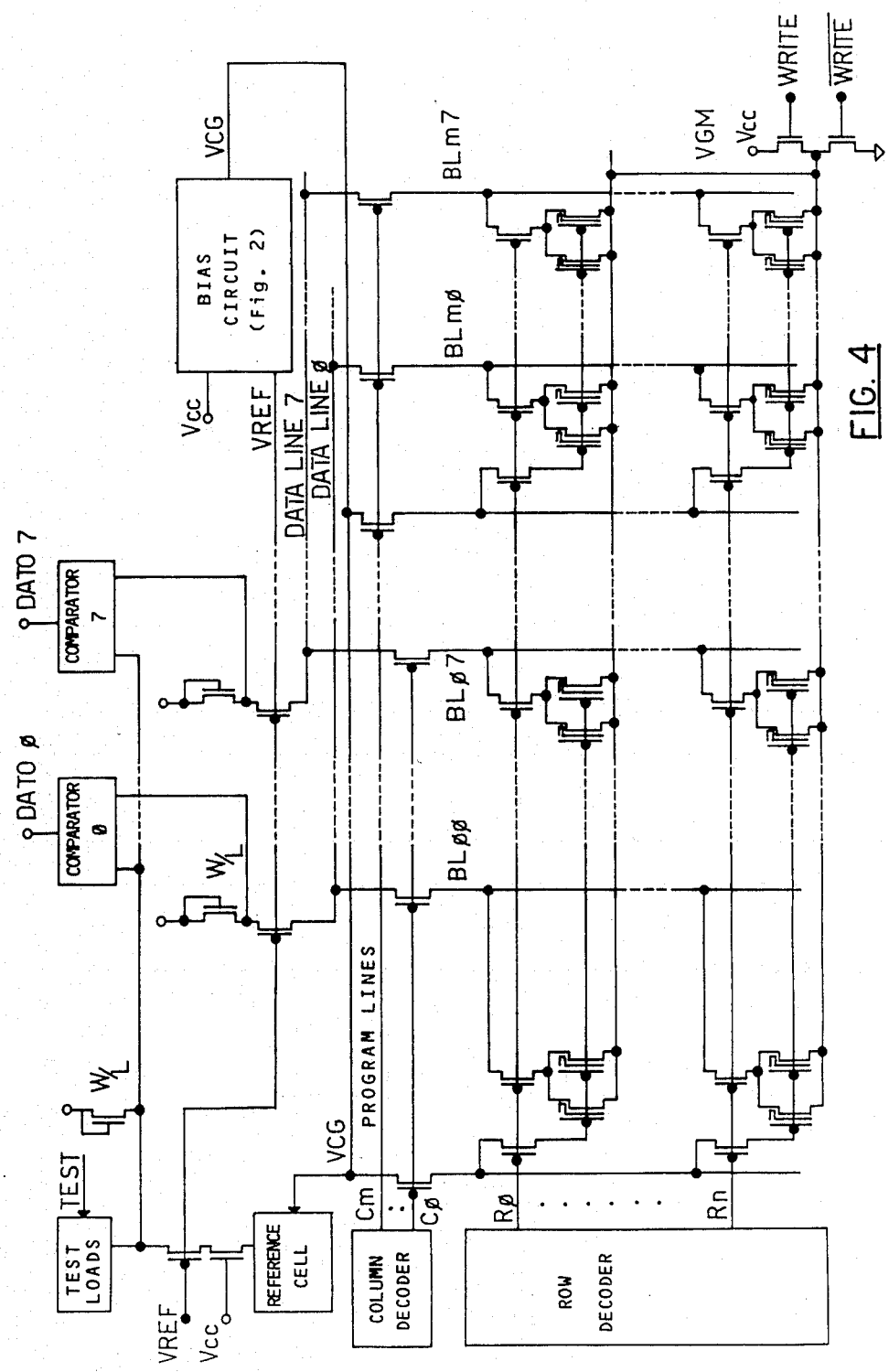
FIG. 4 is a circuit diagram illustrating a particularly preferred memory array architecture utilizing the "semidouble" memory cells of the invention.

A particularly preferred architecture of the memory array of the invention is shown schematically in FIG. 4. Such an arrangement is known and widely used as it is well known to the skilled technician.

As shown, the common potential node $V_{GM}$ of the memory array in order to guarantee a correct operation during writing must be disconnected from the ground node of the circuit, be brought to 4–5 V and subsequently be left floating. This is accomplished by means of two large capacity switches, namely: WRITE and $\overline{\text{WRITE}}$, shown in FIG. 4.

The array is composed of rows containing several bytes, each byte being composed, for example, by eight bits, i.e. by eight "semidouble" cells.

The decoders, respectively the column decoder and the row decoder, by means of respective select transistors, address each one of the semidouble cells (bits) of the memory array.

Through the eight column lines the data stored in the memory cells are transferred to the data lines (DATA LINE $\emptyset, 1, 2, \ldots, 7$), and are read by the eight comparators ($\emptyset, 1, 2, \ldots, 7$).

As it may be observed, the array utilizes a single bias circuit 10, preferably of the type described in relation to FIG. 2, for generating the voltage $V_{CG}$ which is applied to the control gates of each semidouble cell by means of a single program line, to which, by means of select transistors driven respectively by the column decoder and by the row decoder, all the control gates of each byte may be connected.

The nonvolatile memory device of the invention, characterized by the use of semidouble array cells, may also do without using a bias circuit which, during the reading of the array cells, is capable of imposing the discussed condition, namely:

$$I_{C\ broken} = I_{C\ virgin};$$

however this preferred approach minimizes the voltage across the tunnel oxide of the elementary EEPROM cells during the reading phase and this advantageously contributes to increase further the electric charge retention capability also in an array cell no longer perfectly operative. In a reduction to practice of the memory device of the invention, the active area occupied by a semidouble memory cell of the array was 1.6 times greater than the area occupied by an equivalent elementary EEPROM cell. On the other hand the select circuitry occupied advantageously an area equal to that occupied in memory devices made with single EEPROM cells and moreover the sense and bias circuitry did not require a greater area than the area normally occupied by the same circuitry in a memory device made with single EEPROM cells.

By contrast the double cells memory devices of the prior art require an area at least twice the area necessary for a comparable memory device made with single cells; moreover they require duplication of most of the ancillary circuitry such as the column selection and sensing circuitry.

What I claim is:

1. An electrically alterable, nonvolatile memory device, organized as a rows and columns array of addressable memory cells wherein each cell of said array is formed by a pair of n-channel, EEPROM type, elementary memory cells having a source, a drain and a control gate connected substantially in parallel with each other, and the two elementary EEPROM cells of the pair share a single select transistor;

a bias voltage generating circuit for biasing the control gates of said memory cells is essentially a current mirror having a virgin elementary EEPROM type memory cell and a broken elementary EEPROM type memory cell respectively in the two branches thereof, and generates a biasing voltage $V_{CG}$ at an output node, corresponding to the control gate node of the said virgin cell, having a value satisfying the equality relationship of the currents flowing along the two branches of the current mirror;

reading sense amplifiers for reading the bit stored in any addressed memory cell comprise a two input comparator, one input thereof being connected through addressing means and through said select transistor to one of said memory cells of the array, the other input thereof being connected through means simulating said addressing means and said select transistor to a reference cell formed by a pair of virgin n-channel, EEPROM TYPE, elementary memory cells similar to the ones forming said memory array cells and having a source, a drain and a control gate substantially connected in parallel with each other;

the said reference cell establishing a comparator threshold in terms of current given by the relation:

$$I_{sensing} = 2I_{virgin};$$

the bit reading threshold being given by the following relation:

$$I_{Cell\ erased} + I_{Cell\ virgin} < I_{sensing} < I_{Cell\ written} + I_{Cell\ virgin}.$$

2. The memory device according to claim 1, wherein means are provided for incrementally lowering said comparator threshold.

3. The memory device according to claim 2, wherein said means for incrementally decreasing the threshold are unitary loads which may be connected in parallel with an input load of the comparator's input connected to said reference cell.

* * * * *